United States Patent
Watanabe et al.

(10) Patent No.: US 11,296,275 B2
(45) Date of Patent: Apr. 5, 2022

(54) PIEZOELECTRIC DEVICE, PIEZOELECTRIC VIBRATING PIECE, AND METHOD FOR MANUFACTURING PIEZOELECTRIC VIBRATING PIECE

(71) Applicant: NIHON DEMPA KOGYO CO., LTD., Tokyo (JP)

(72) Inventors: Tetsuya Watanabe, Saitama (JP); Hirokazu Iwata, Saitama (JP); Yoshiharu Sato, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 806 days.

(21) Appl. No.: 16/136,291

(22) Filed: Sep. 20, 2018

(65) Prior Publication Data

US 2019/0097123 A1 Mar. 28, 2019

(30) Foreign Application Priority Data

Sep. 26, 2017 (JP) .............................. JP2017-184708

(51) Int. Cl.
| | | |
|---|---|---|
| H01L 41/053 | (2006.01) |
| H01L 41/09 | (2006.01) |
| H01L 41/047 | (2006.01) |
| H03H 9/02 | (2006.01) |
| H01L 41/332 | (2013.01) |
| H03H 9/17 | (2006.01) |
| H03H 9/19 | (2006.01) |
| H01L 41/18 | (2006.01) |

(52) U.S. Cl.
CPC .......... *H01L 41/332* (2013.01); *H01L 41/053* (2013.01); *H01L 41/09* (2013.01); *H01L 41/18* (2013.01); *H03H 9/02023* (2013.01); *H03H 9/02047* (2013.01); *H03H 9/02094* (2013.01); *H03H 9/177* (2013.01); *H03H 9/19* (2013.01); *H01L 41/047* (2013.01)

(58) Field of Classification Search
CPC ..... H01L 41/053; H01L 41/09; H01L 41/047; H03H 9/1021; H03H 9/17; H03H 9/19
USPC .......................................................... 310/367
See application file for complete search history.

(56) References Cited

U.S. PATENT DOCUMENTS

| | | | | |
|---|---|---|---|---|
| 5,444,325 | A * | 8/1995 | Haas ..................... | H03H 9/0509 310/348 |
| 2013/0320809 | A1* | 12/2013 | Takahashi ............. | H01L 41/053 310/344 |
| 2016/0226465 | A1* | 8/2016 | Yamashita ......... | H03H 9/02157 |

FOREIGN PATENT DOCUMENTS

| | | |
|---|---|---|
| JP | 2000031781 | 1/2000 |
| JP | 2010062795 | 3/2010 |
| JP | 2016197778 | 11/2016 |

(Continued)

OTHER PUBLICATIONS

Office Action of Japan Counterpart Application, with English translation thereof, dated Mar. 23, 2021, pp. 1-7.

*Primary Examiner* — Derek J Rosenau
(74) *Attorney, Agent, or Firm* — JCIPRNET

(57) ABSTRACT

A piezoelectric device includes a piezoelectric vibrating piece and a container. The piezoelectric vibrating piece has a rectangular planar shape and has a portion of a first side secured to the container. The piezoelectric vibrating piece has a second side opposing the first side and includes a projecting portion that projects outward from the second side in at least one of proximity of both ends of the second side along the second side.

7 Claims, 6 Drawing Sheets

(56) References Cited

FOREIGN PATENT DOCUMENTS

JP        2018110292       7/2018

\* cited by examiner

PIEZOELECTRIC DEVICE, PIEZOELECTRIC VIBRATING PIECE, AND METHOD FOR MANUFACTURING PIEZOELECTRIC VIBRATING PIECE

CROSS-REFERENCE TO RELATED APPLICATIONS

This application is based on and claims priority under 35 U.S.C. § 119 to Japanese Patent Application No. 2017-184708, filed on Sep. 26, 2017, the entire content of which is incorporated herein by reference.

TECHNICAL FIELD

This disclosure relates to a piezoelectric device, such as a crystal unit, a crystal controlled oscillator including a crystal unit, a crystal unit with a temperature sensor, such as a thermistor and a PN diode, a piezoelectric vibrating piece preferably used for the piezoelectric device, and a method for manufacturing this piezoelectric vibrating piece.

DESCRIPTION OF THE RELATED ART

A photolithography technique and a wet etching technique are used in order to achieve a further downsized crystal unit, which is a kind of a piezoelectric device.

For example, Japanese Unexamined Patent Application Publication No. 2010-62795 discloses a crystal unit using the above-described technique and a method for manufacturing the crystal unit. Specifically, as illustrated in FIG. 1 in Japanese Unexamined Patent Application Publication No. 2010-62795, the above-described technique manufactures a quartz-crystal wafer including a plurality of crosspieces and many crystal elements connected to the respective crosspieces via connecting portions. Then, each of crystal elements is snapped off of this quartz-crystal wafer near the connecting portion and the snapped off crystal element is installed in a container, and then sealed. This obtains an intended crystal unit. This method can manufacture a large amount of small-sized crystal units by a wafer process.

However, while an end of the crystal element in a side of the connecting portion is secured to the container with a conductive adhesive in Japanese Unexamined Patent Application Publication No. 2010-62795, an opposite side to the connecting portion side of the crystal element, that is, a distal end, is not in a special shape but in a side in a linear shape (for example, FIG. 9 in Japanese Unexamined Patent Application Publication No. 2010-62795). Accordingly, in the case where the distal end of the crystal element is installed in the container in a bowing state by any chance, and additionally, bowing degree is not good, the distal end of the crystal element contacts a bottom surface of the container. An occurrence of such a contact causes degradation of characteristics of the crystal unit.

A need thus exists for a piezoelectric device, a piezoelectric vibrating piece, and a method for manufacturing the piezoelectric vibrating piece which are not susceptible to the drawback mentioned above.

SUMMARY

According to an aspect of this disclosure, there is provided a piezoelectric device that includes a piezoelectric vibrating piece and a container. The piezoelectric vibrating piece has a rectangular planar shape and has a portion of a first side secured to the container. The piezoelectric vibrating piece has a second side opposing the first side and includes a projecting portion that projects outward from the second side in at least one of proximity of both ends of the second side along the second side.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

Figure 1A:
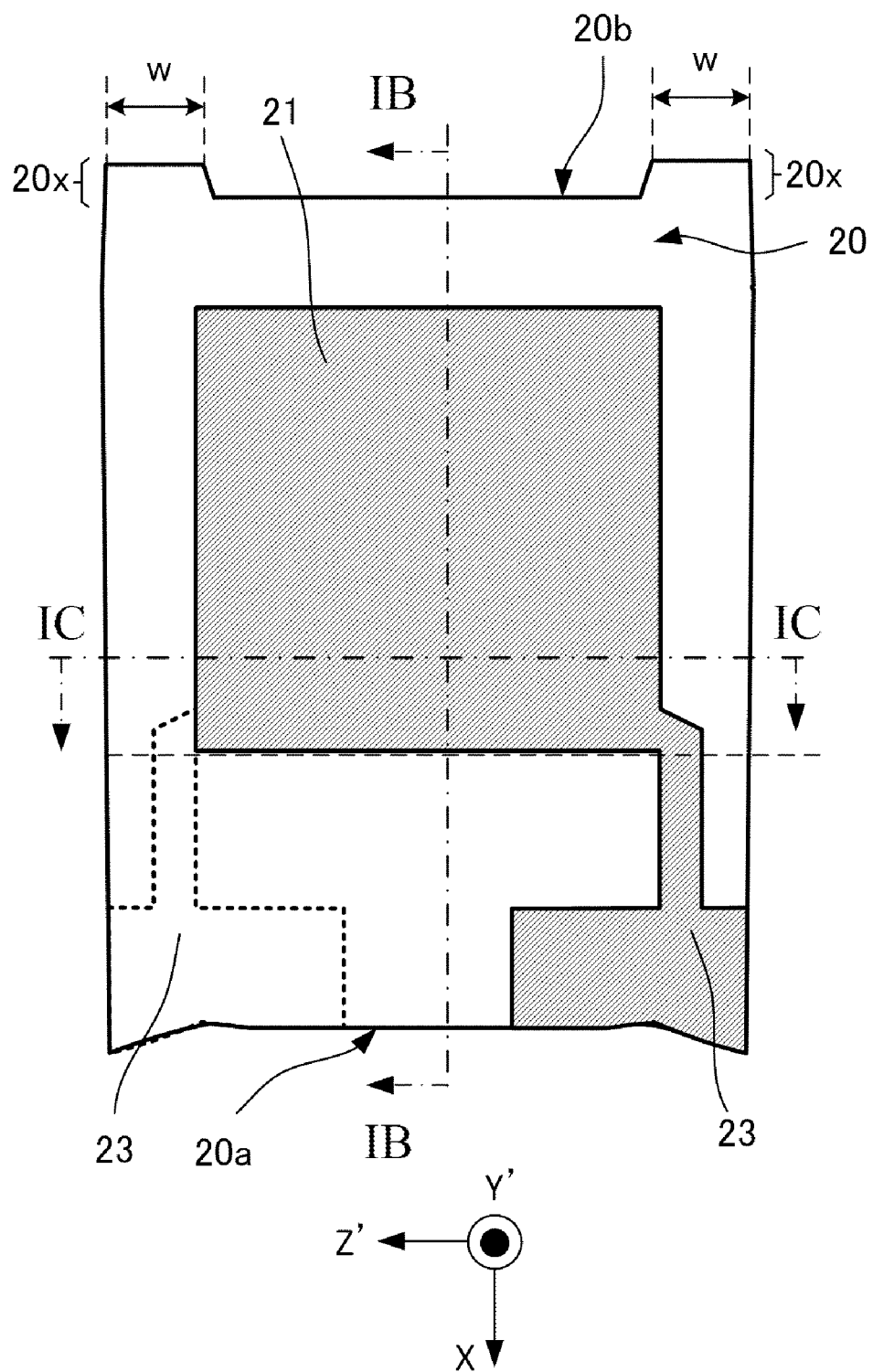
FIG. 1A to FIG. 1C are explanatory drawings of a piezoelectric vibrating piece 20 included in a piezoelectric resonator according to an embodiment.

The following describes embodiments of a piezoelectric resonator and a method for manufacturing the same of the disclosure with reference to the drawings. Each drawing used in the descriptions is merely illustrated for understanding the embodiments. In each drawing used in the description, like reference numerals designate corresponding or identical elements, and therefore such elements will not be further elaborated in some cases. Shapes, dimensions, materials, and similar factor described in the following descriptions are merely preferable examples within the scope of the disclosure. Therefore, the disclosure is not limited only to the following embodiments.

1. Description of Piezoelectric Resonator

Figure 1B:
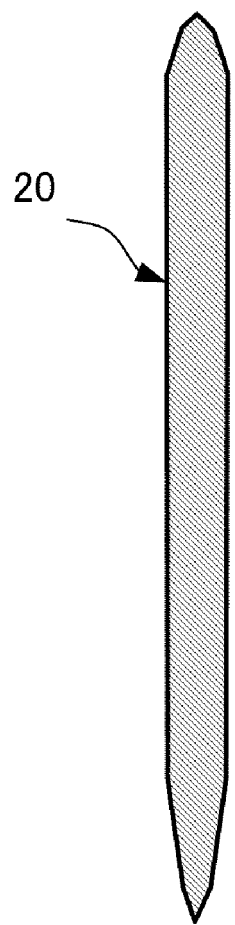
Figure 1C:
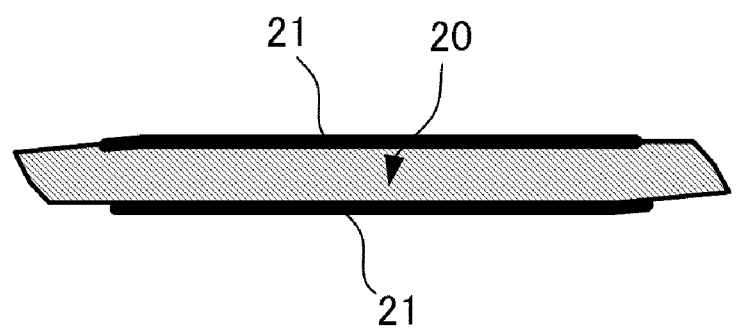
Figure 2A:
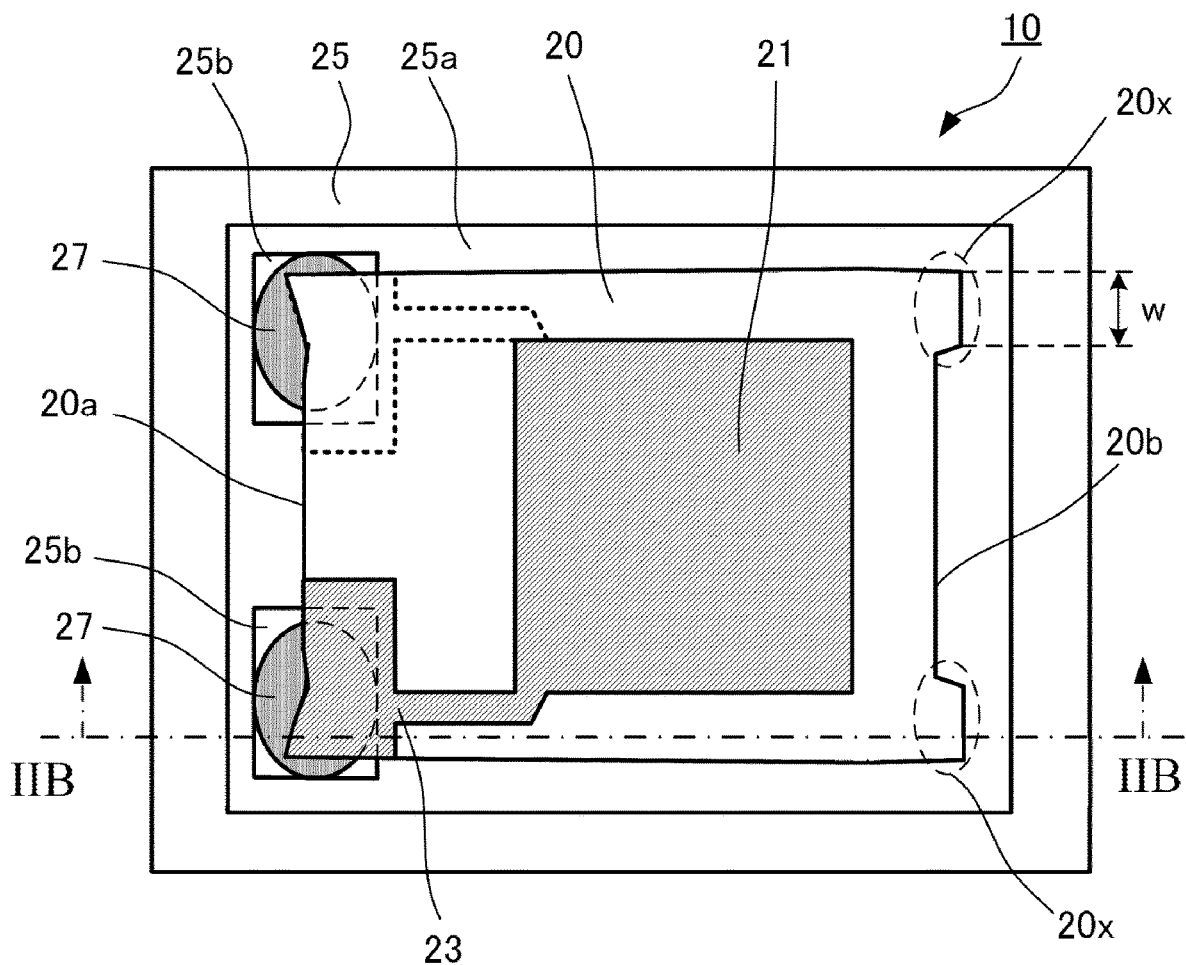
FIG. 2A to FIG. 2C are explanatory drawings of the piezoelectric resonator and an explanatory drawing of its effects.
Figure 2B:
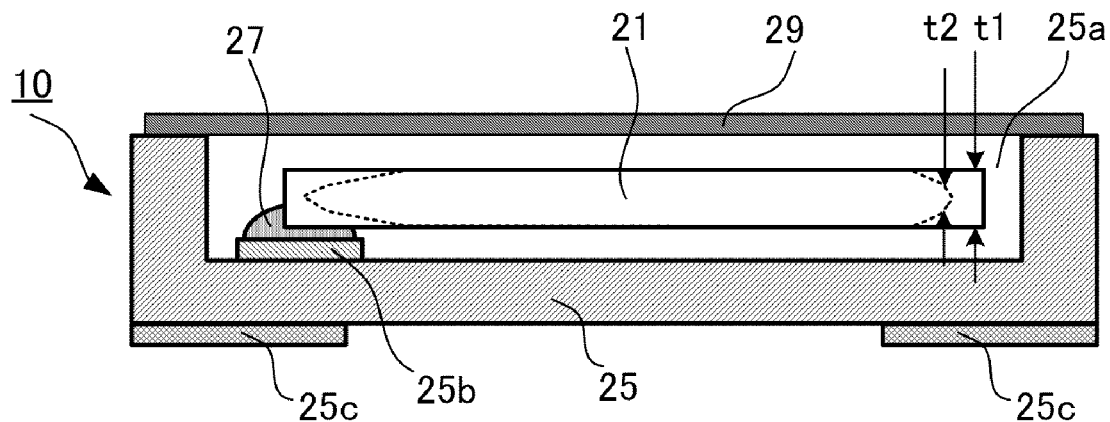
Figure 2C:
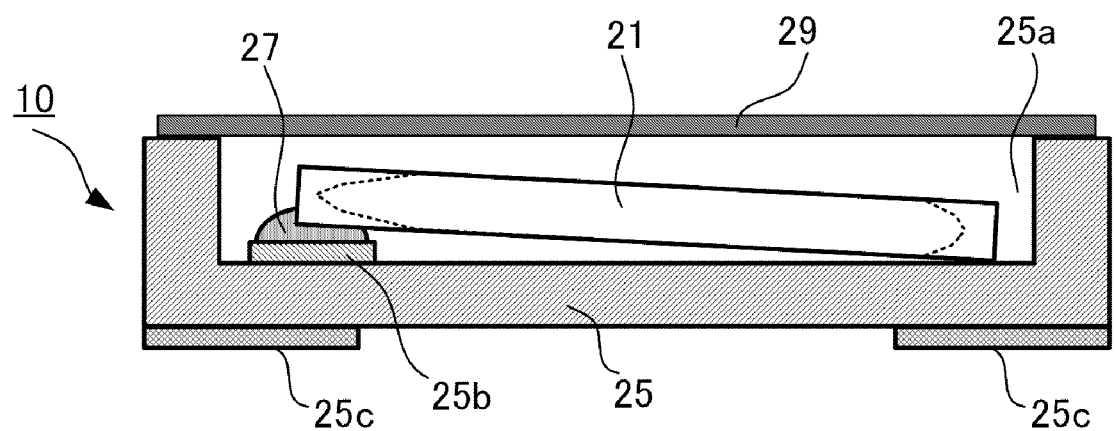

First, a piezoelectric vibrating piece 20 included in a piezoelectric device 10 (FIG. 2A) of an embodiment will be described. FIG. 1A is a plan view of the piezoelectric vibrating piece 20, FIG. 1B is a sectional drawing of the piezoelectric vibrating piece 20 taken along a line IB-IB in FIG. 1A, and FIG. 1C is a sectional drawing of the piezoelectric vibrating piece 20 taken along a line IC-IC in FIG. 1A. FIG. 2A is a plan view of the piezoelectric device 10 and is a plan view illustrating a state where the piezoelectric vibrating piece 20 is installed in a container 25. FIG. 2B is a sectional drawing of the piezoelectric device 10 taken along a line IIB-IIB in FIG. 2A. FIG. 2C is a drawing describing effects of the piezoelectric device 10 and the piezoelectric vibrating piece 20 of the disclosure.

In this embodiment, an AT-cut crystal element is used as the piezoelectric vibrating piece 20. Coordinate axes X, Y', and Z' illustrated in FIG. 1A are respective crystallographic axes of a crystal in the AT-cut crystal element 20. Note that, the AT-cut crystal element itself is described in, for example, "Handbook of Quartz Crystal Device" (Fourth Edition, page 7 or other pages, published by Quartz Crystal Industry Association of Japan, March 2002) in detail. Therefore, the explanation will be omitted here. In the following description, the piezoelectric vibrating piece 20 is also referred to as the crystal element 20.

The crystal element 20 of this embodiment is an AT-cut crystal element that has a rectangular planar shape, and its long side is parallel to an X-axis of the crystal and its short side is parallel to a Z'-axis of the crystal.

This crystal element 20 includes an excitation electrode 21 and an extraction electrode 23 on its both principal surfaces. The extraction electrodes 23 are extracted from the excitation electrodes 21 to proximity of both ends of a first side 20a, which is one side of the crystal element 20.

This crystal element 20 is installed inside a depressed portion 25a of the container 25 as illustrated in FIG. 2A. Specifically, this crystal element 20 is secured to support pads 25b of the container 25 in the proximity of both ends on a portion of the first side 20a and along the first side 20a with, for example, conductive adhesives 27. That is, the crystal element 20 has the first side 20a side held in a cantilever manner in the container 25.

For the container 25, for example, a ceramic package can be used. This container 25 has a bottom surface on an external side including external mounting terminals 25c in order for this piezoelectric device 10 to connect to another electronic device.

The crystal element 20 is sealed within the container 25 with a preferred lid member 29 bonded on a dike that surrounds the depressed portion 25a of the container 25.

Furthermore, this crystal element 20 has a second side 20b that opposes the first side 20a. This crystal element 20 includes a projecting portion 20x that projects outward from the second side 20b in at least one of proximity of both ends of the second side along this second side 20b as a feature of this disclosure. In this embodiment, the projecting portion 20x is disposed to project out from each of both end regions along the second side 20b of the crystal element 20 and in a direction along the long side of the crystal element 20.

The projecting portion 20x in this example has a distal end portion having a thickness t1 (see FIG. 2B) thicker than a thickness t2 (see FIG. 2B) at a portion near the second side 20b other than this projecting portion 20x.

This projecting portion 20x has a dimension w in a direction along the second side 20b. The dimension w is preferred to be equal to or less than one-fourth, more preferably, equal to or less than one-fifth of a dimension of the second side 20b of the crystal element 20.

The reason of t1>t2 is that this way makes a structure in which the projecting portion 20x projects more outward than the second side 20b projects even in a thickness direction of the crystal element 20 as illustrated in FIG. 2C. Accordingly, even when the distal end of the crystal element 20 is secured to the container in a bowing state, the projecting portion 20x contacts the bottom surface of the container 25 to prevent the second side 20b from contacting the container 25.

The reason of the dimension w being made equal to or less than one-fourth of the dimension of the second side 20b of the crystal element 20 is as follows.

In a case of an AT-cut crystal element, a main vibration wave mainly propagates along the X-axis direction of the crystal. Additionally, the wave that propagates along the X-axis through a center of the crystal element has intensity stronger than that the wave along edges has. Accordingly, in this example, the intensity of the wave gets strong near the center of the second side 20b; therefore it is better preventing the proximity of the center from contacting the bottom surface of the container. In order to achieve this, it is preferred that the projecting portions 20x are disposed on both ends along the second side 20b and keeps away from the center of the second side 20b. Taking this point into consideration, it is preferred that the projecting portions 20x are disposed on both ends in a direction along the second side 20b and the dimension w is equal to or less than one-fourth, more preferably, equal to or less than one-fifth of the dimension of the second side 20b of the crystal element 20, in accordance with examinations by the inventors.

The dimension along the longitudinal direction of the crystal element 20 of the projecting portion 20x is preferred to be, for example, in a range of one-fortieth to one-twentieth of the long side dimension.

Note that the two projecting portions 20x may be of identical or different dimensions w. However, it is preferred to be identical if possible. When it is asymmetric, a vibration characteristic is possibly negatively affected. The two projecting portions 20x may have identical or different projections along a longitudinal direction of the crystal element 20. However, it is preferred to be identical if possible. When it is asymmetric, the vibration characteristic is possibly negatively affected.

The piezoelectric device 10 according to this disclosure ensures preventing the region along the second side 20b of the crystal element 20 from contacting the bottom surface of the container 25 with the projecting portion 20x even when the crystal element 20 is secured to the container 25 in a state where the distal end of the crystal element 20 bows so as to contact the bottom surface of the container 25 as illustrated in FIG. 2C.

Figure 3A:
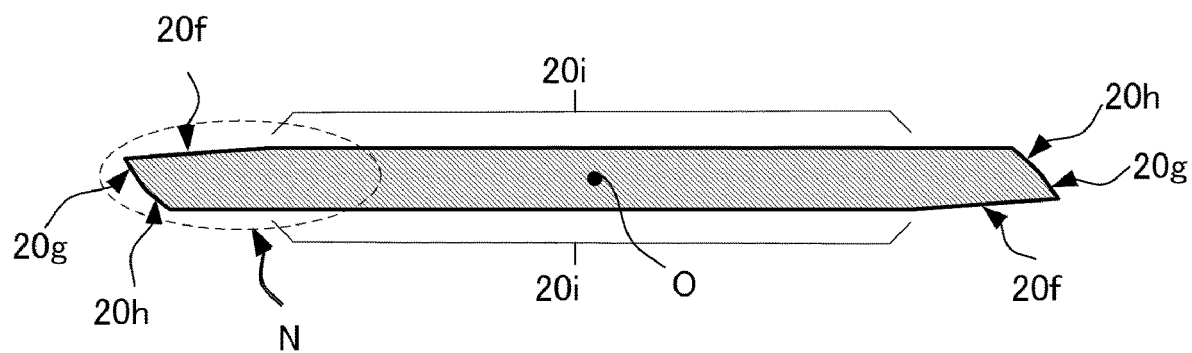
FIG. 3A and FIG. 3B are explanatory drawings of a side surface that intersects with, in particular, a Z'-axis of the piezoelectric vibrating piece 20.
Figure 3B:
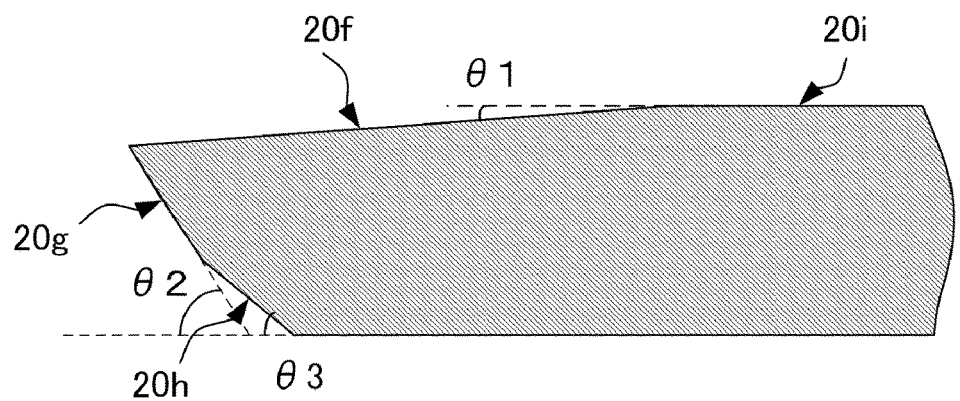

The crystal element 20 may have a side surface intersecting with the Z'-axis of the crystal in the following structure. FIG. 3A and FIG. 3B are explanatory drawings for the structure, in particular, FIG. 3A is a detailed drawing of FIG. 1C and FIG. 3B is an enlarged figure of a part N in FIG. 3A.

In the case of the crystal element 20 described by referring to this FIG. 3A and FIG. 3B, side surfaces (Z'-surfaces) that intersect with the Z'-axis of the crystal are side surfaces constituted of three respective surfaces of a first surface 20f, a second surface 20g, and a third surface 20h. Moreover, the first surface 20f is a surface that intersects with a principal surface 20i of this crystal element 20, and additionally, a surface corresponding to a surface where the principal surface 20i is rotated around the X-axis of the crystal as a rotation axis by θ1.

Furthermore, in this crystal element 20, the first surface 20f, the second surface 20g, and the third surface 20h intersect in this order. Moreover, the second surface 20g is a surface corresponding to a surface where the principal surface 20i is rotated around the X-axis of the crystal as the rotation axis by θ2, and the third surface 20h is a surface corresponding to a surface where the principal surface 20i is rotated around the X-axis of the crystal as the rotation axis by θ3. Additionally, the two side surfaces are disposed to be in a relation of a point symmetry with respect to a center point O of the crystal element.

The above-described angles θ1, θ2, and θ3 are known to preferably have the values below from an experiment relates to this applicant. θ1=4°±3.5°, θ2=−57°±5°, θ3=−42°±5°, more preferably, θ1=4°±3°, θ2=−57°±3°, θ3=−42°±3°.

In the case of the crystal element having the side surfaces described using these FIG. 3A and FIG. 3B, the side surface is configured in a unique beak shape, thus this part ensures decreasing an unnecessary vibration propagating in the Z' direction, thereby ensuring a contribution to an improvement of characteristics of the piezoelectric device by this surface. Note that this structure is disclosed in Japanese Unexamined Patent Application Publication No. 2016-197778 by this applicant, thus the description will not be further elaborated here.

2. Description of Manufacturing Method

Next, an embodiment of a manufacturing method according to this application will be described with reference mainly to FIG. 4A and FIG. 4B.

Figure 4A:
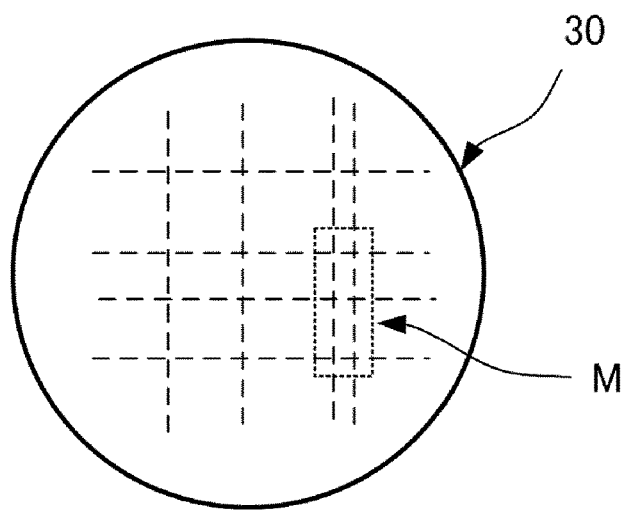
FIG. 4A and FIG. 4B are drawings describing a main part of a manufacturing method.
Figure 4B:
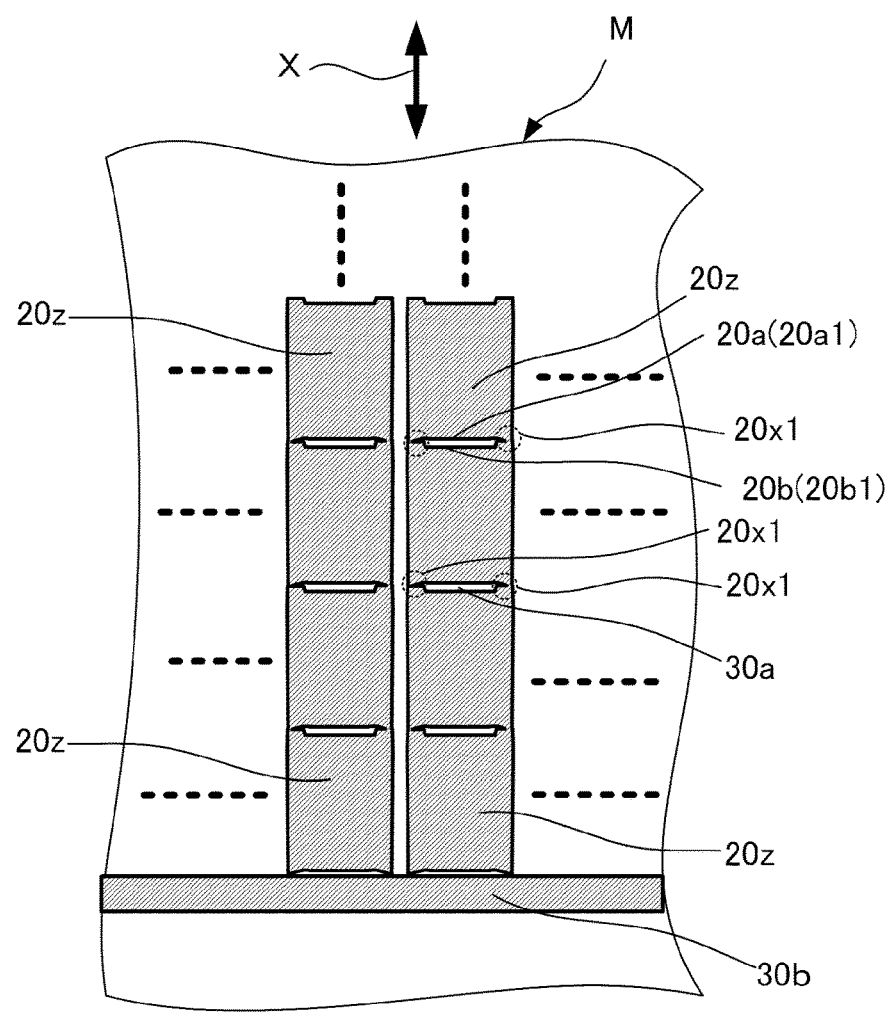

FIG. 4A and FIG. 4B are drawings describing a main part of a process for manufacturing the crystal element 20. FIG. 4A is a plan view describing a piezoelectric wafer 30 in an intermediate state and FIG. 4B is a plan view illustrating a part M of this wafer 30 enlarged.

In the disclosure of the manufacturing method of this application, the following devisals are made in manufacturing the above-described piezoelectric vibrating piece, which has a rectangular planar shape, has a portion of a first side as a securing region to a container, has a second side opposing the first side, and includes a projecting portion projecting outward from the second side in at least one of the proximity of both ends of the second side along the second side.

That is, this manufacturing method includes defining formation-scheduled regions for piezoelectric vibrating pieces 20z in the piezoelectric wafer 30 in a matrix as illustrated in FIG. 4A and FIG. 4B. Specifically, this manufacturing method includes a process in which, for example, metal films having a hydrofluoric acid resistance are formed on a front and a back of the piezoelectric wafer 30, then, these metal films are patterned by the photolithography technique and the metal etching technique, and the piezoelectric vibrating piece formation-scheduled regions 20z are formed in a matrix.

However, when a direction perpendicular to the first side 20a and the second side 20b of the piezoelectric vibrating piece is defined as a first direction (indicated by X in FIG. 4B) then, each of the formation-scheduled regions for piezoelectric vibrating pieces 20z disposed in the first direction X forms a pattern for photolithography such that a second side 20b1 (see FIG. 4B) of one's own and a first side 20a1 (see FIG. 4B) of a formation-scheduled region for another piezoelectric vibrating piece 20z that neighbors at a portion of this second side 20b1 are connected in a formation-scheduled region for a projecting portion 20x1 (see FIG. 4B). However, the formation-scheduled regions for the piezoelectric vibrating pieces 20z that correspond to both ends among many formation-scheduled regions for the piezoelectric vibrating pieces 20z arranged in the first direction X are connected to crosspieces 30b of the piezoelectric wafer 30.

In a state prepared as described above, a portion of the piezoelectric wafer 30 other than the formation-scheduled regions for the piezoelectric vibrating pieces 20z and the formation-scheduled regions for the projecting portions 20x1 is etched. This etching ensures obtaining the crystal element 20 illustrated in FIG. 1A to FIG. 1C but in a state before the excitation electrode 21 is formed. At this time, a side surface of the crystal element 20 becomes a tapered shape as illustrated in FIG. 1A to FIG. 1C and FIG. 3A and FIG. 3B. Next, a known technique forms the excitation electrode 21 and similar part. Then, an external force is applied to regions including regions corresponding to the formation-scheduled regions for the projecting portions 20x1 to individualize the respective crystal elements 20.

Note that, while the formation-scheduled region for the projecting portion 20x1 may be disposed on at least one of both ends along the second side 20b, it is preferred to be disposed on both ends. Then, it is preferred that a middle region 30a made of a slit passing through the piezoelectric wafer or a middle region 30a made of a portion having a thickness thinner than both ends are formed between these two formation-scheduled regions for the projecting portion 20x1. This facilitates individualizing the piezoelectric vibrating pieces 20. Note that such middle regions 30a can be formed, for example, by a method that forms a mask that opens formation-scheduled regions for the middle regions of the piezoelectric wafer and etches portions exposed from this mask or a method that makes this mask width a micro width and causes the portions exposed from this mask to stop at half etching.

Note that, while the description of the above-described embodiment of the manufacturing process omitted a description of a forming procedure of the excitation electrode 21 and the extraction electrode 23, these procedures can be performed by a known method.

This manufacturing method ensures arranging a large count of the piezoelectric resonators in the first direction compared with a conventional method, thereby achieving a reduced manufacturing cost of the piezoelectric vibrating piece.

3. Other Embodiments

In the above, while the respective embodiments of the piezoelectric device, the piezoelectric vibrating piece, and the manufacturing method have been described, a piezoelectric material is not limited to the crystal but may be another piezoelectric material. While the used container has been described as a container having a depressed portion and the used lid member has been described as one in a flat plate shape, the container may be in a flat plate shape and the lid member may be in a cap shape.

According to another aspect of this disclosure, there is provided a piezoelectric vibrating piece having a rectangular planar shape includes a portion of a first side used as a securing portion to a container and a second side opposing the first side. The piezoelectric vibrating piece includes a projecting portion that projects outward from the second side in at least one of proximity of both ends of the second side along the second side.

According to yet another aspect of this disclosure, there is provided a method for manufacturing a piezoelectric vibrating piece that has a rectangular planar shape, has a portion of a first side as a securing portion to a container, has a second side opposing the first side, and includes a projecting portion that projects outward from the second side in at least one of proximity of both ends of the second side along the second side. The method includes defining a formation-scheduled region for the piezoelectric vibrating piece in a piezoelectric wafer in a matrix, in which a direction perpendicular to the first side and the second side is defined as a first direction, and each of the formation-scheduled regions for the piezoelectric vibrating piece is arranged in the first direction; forming a pattern for photolithography such that a second side of one formation-scheduled region for the piezoelectric vibrating piece and a first side of another neighboring formation-scheduled region for the piezoelectric vibrating piece are connected in a formation-scheduled region for the projecting portion; and etching a portion other than the formation-scheduled region for the piezoelectric vibrating piece and the formation-scheduled region for the projecting portion of the piezoelectric wafer.

With the piezoelectric device and the piezoelectric vibrating piece according to the embodiments, even when the piezoelectric vibrating piece is secured to the container in a bowing state and the distal end of the piezoelectric vibrating piece contacts a container bottom surface, a contact occurs only in the projecting portion and a portion of the piezoelectric vibrating piece with a large vibration displacement does not contact the container bottom surface since a predetermined projecting portion is included in the opposite side to a side where the piezoelectric vibrating piece is secured to the container. Therefore, an effect from contacting the container can be reduced compared with a conventional way even when the distal end of the piezoelectric vibrating piece contacts the container.

The manufacturing method according to the embodiment ensures easily manufacturing the piezoelectric vibrating piece having the above-described projecting portions. Moreover, the piezoelectric vibrating pieces neighboring in the first direction can be arranged in the wafer in a state closely neighboring one another, thereby ensuring the increased filling up count of the piezoelectric vibrating piece in the first direction with respect to the wafer, thus ensuring achieving a reduced production cost of the piezoelectric device and the piezoelectric vibrating piece.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A piezoelectric device comprising:
   a piezoelectric vibrating piece that has a rectangular planar shape; and
   a container, wherein
   the piezoelectric vibrating piece has a portion of a first side secured to the container,
   the piezoelectric vibrating piece has a second side opposing the first side, the piezoelectric vibrating piece comprises a projecting portion that projects outward from the second side in at least one of proximity of both ends of the second side along the second side,
   wherein the projecting portion has a distal end portion, at least the distal end portion having a thickness thicker than a thickness at a portion near the second side other than the projecting portion.

2. The piezoelectric device according to claim 1, wherein the projecting portion has a dimension in a direction along the second side, the dimension being equal to or less than one-fourth of a dimension of the second side.

3. A piezoelectric vibrating piece having a rectangular planar shape, comprising:
   a portion of a first side used as a securing portion to a container;
   a second side opposing the first side, wherein
   the piezoelectric vibrating piece comprises a projecting portion that projects outward from the second side in at least one of proximity of both ends of the second side along the second side,
   wherein the projecting portion has a distal end portion, at least the distal end portion having a thickness thicker than a thickness at a portion near the second side other than the projecting portion.

4. The piezoelectric vibrating piece according to claim 3, wherein
   the projecting portion has a dimension in a direction along the second side, the dimension being equal to or less than one-fourth of a dimension of the second side.

5. A method for manufacturing a piezoelectric vibrating piece, wherein
   the piezoelectric vibrating piece has a rectangular planar shape, the piezoelectric vibrating piece has a portion of a first side as a securing portion to a container, the piezoelectric vibrating piece has a second side opposing the first side, the piezoelectric vibrating piece comprises a projecting portion that projects outward from the second side in at least one of proximity of both ends of the second side along the second side, wherein the projecting portion has a distal end portion, at least the distal end portion having a thickness thicker than a thickness at a portion near the second side other than the projecting portion, the method comprises:
   defining a formation-scheduled region for the piezoelectric vibrating piece in a piezoelectric wafer in a matrix, wherein a direction perpendicular to the first side and the second side is defined as a first direction, and each of the formation-scheduled regions for the piezoelectric vibrating piece is arranged in the first direction;
   forming a pattern for photolithography such that a second side of one formation-scheduled region for the piezoelectric vibrating piece and a first side of another neighboring formation-scheduled region for the piezoelectric vibrating piece are connected in a formation-scheduled region for the projecting portion; and
   etching a portion other than the formation-scheduled region for the piezoelectric vibrating piece and the formation-scheduled region for the projecting portion of the piezoelectric wafer.

6. The method for manufacturing the piezoelectric vibrating piece according to claim 5, further comprising:
   forming the formation-scheduled regions for the projecting portions in both respective ends along the second side and forming middle regions made of slits passing through the piezoelectric wafer or middle regions made of portions having a thickness thinner than both ends between the two formation-scheduled regions for the projecting portions.

7. The method for manufacturing the piezoelectric vibrating piece according to claim 5, further comprising:
   applying an external force to a region including a region corresponding to the formation-scheduled region for the projecting portion to individualize each of the crystal elements.

* * * * *